(12) United States Patent
Yeh et al.

(10) Patent No.: US 8,698,180 B2
(45) Date of Patent: Apr. 15, 2014

(54) LED LIGHTING ASSEMBLY INTEGRATED WITH DIELECTRIC LIQUID LENS

(71) Applicant: Lustrous Technology Ltd., New Taipei (TW)

(72) Inventors: Jer-Liang Yeh, Taichung (TW); Chun-Wen Chen, Tainan (TW)

(73) Assignee: Lustrous Technology Ltd., New Taipei (TW)

( * ) Notice: Subject to any disclaimer, the term of this patent is extended or adjusted under 35 U.S.C. 154(b) by 0 days.

(21) Appl. No.: 13/748,750

(22) Filed: Jan. 24, 2013

(65) Prior Publication Data
US 2014/0034979 A1 Feb. 6, 2014

(30) Foreign Application Priority Data
Aug. 6, 2012 (TW) ............... 101128172 A

(51) Int. Cl.
*H01L 33/00* (2010.01)

(52) U.S. Cl.
USPC .. 257/98; 257/99; 257/E33.073; 257/E33.075

(58) Field of Classification Search
USPC ................. 257/98, 99, E33.073, E33.075
See application file for complete search history.

(56) References Cited

U.S. PATENT DOCUMENTS 7,936,520 B2 * 5/2011 Yeh ............................... 359/666
2010/0277923 A1 * 11/2010 Takai et al. ............... 362/296.01

* cited by examiner

*Primary Examiner* — Minh-Loan T Tran
(74) *Attorney, Agent, or Firm* — Guice Patents PLLC

(57) ABSTRACT

An LED lighting assembly integrated with dielectric liquid lens, including: a heat dissipation substrate; an LED chip, located on the heat dissipation substrate; a transparent material, covering the heat dissipation substrate and the LED chip and having a curved surface; a transparent liquid, located above the transparent material; a transparent layer, located above the transparent liquid; a first dielectric liquid, located above the transparent layer; a second dielectric liquid, located above the first dielectric liquid and having a curved surface, wherein the second dielectric liquid has a second dielectric constant smaller than a first dielectric constant of the first dielectric liquid; a transparent electrode layer, located above the second dielectric liquid for applying a control voltage to generate a dielectric force on the second dielectric liquid; and an enclosing body.

22 Claims, 4 Drawing Sheets

0V

30V

60V

LED LIGHTING ASSEMBLY INTEGRATED WITH DIELECTRIC LIQUID LENS

BACKGROUND OF THE INVENTION

1. Field of the Invention

The present invention relates to an LED lighting assembly, especially to an LED lighting assembly integrated with a dielectric liquid lens.

2. Description of the Related Art

A lighting fixture is generally used in a traditional lighting assembly to generate a fixed light pattern. However, as the fixed light pattern for one application may not be suitable for another application, different lighting fixtures have to be designed and manufactured to meet different requirements. This is a disadvantage of traditional lighting assemblies.

LED (light emitting diode) is one of major modern green products, and many countries have planned to replace incandescent light bulbs with LEDs. However, as LEDs tend to emit light in a single direction, a reflective cup or mirror is therefore needed to adjust luminance distribution for different applications. Using the reflective cup or mirror for light pattern shaping can cause some disadvantages. First, the focus thereof cannot be adjusted easily; second, the assembly thereof is not robust enough for transportation; and third, heat dissipation can be an issue.

A published patent US 2010/0277923 discloses a design using an electrowetting liquid lens to adjust a light pattern. However, a disadvantage is there in using the electrowetting liquid lens—it involves applying an electrowetting force on a conductive liquid to alter the curvature of the lens, and to avoid short circuit, insulation measures have to be taken. Besides, US 2010/0277923 does not teach how to dissipate a heat generated by the light source thereof, and it is known that inefficient heat dissipation can not only degrade luminous efficiency, but also cause a safety issue.

To solve the foregoing problems, an LED lighting assembly having a novel structure is needed.

SUMMARY OF THE INVENTION

One objective of the present invention is to disclose an LED lighting assembly, which is integrated with a non-conductive dielectric liquid lens.

Another objective of the present invention is to disclose an LED lighting assembly, which has a heat dissipation substrate to carry an LED chip and dissipate a heat generated by the LED chip.

Another objective of the present invention is to disclose an LED lighting assembly, which can use a liquid to assist in dissipating heat.

Another objective of the present invention is to disclose an LED lighting assembly, which possesses a robust package convenient for transportation.

Still another objective of the present invention is to disclose an LED lighting assembly, which has a composite focal length formed by two focal lengths to facilitate generating a light pattern of the LED lighting assembly.

To attain the foregoing objectives, an LED lighting assembly integrated with dielectric liquid lens is proposed, including:

a heat dissipation substrate;

an LED chip, located on the heat dissipation substrate;

a transparent material, covering the heat dissipation substrate and the LED chip, and having a curved surface;

a transparent liquid, located above the transparent material;

a transparent layer, located above the transparent liquid;

a first dielectric liquid, located above the transparent layer;

a second dielectric liquid, located above the first dielectric liquid and having a curved surface, wherein the second dielectric liquid has a second dielectric constant smaller than a first dielectric constant of the first dielectric liquid;

a transparent electrode layer, located above the second dielectric liquid for applying a control voltage to generate a dielectric force on the second dielectric liquid; and an enclosing body, having a ring structure combining with the heat dissipation substrate, the transparent layer, and the transparent electrode layer to form two enclosed spaces for accommodating the transparent liquid, the first dielectric liquid, and the second dielectric liquid.

In one embodiment, the heat dissipation substrate is an aluminum substrate, and the transparent material is a transparent resin.

In one embodiment, the LED chip is a white light LED chip.

In one embodiment, the LED chip is a non-white light LED chip.

In one embodiment, the transparent resin is mixed with a fluorescent powder.

In one embodiment, the transparent liquid is a silicone oil, and the transparent layer is a glass layer.

In one embodiment, the transparent liquid is an alcohol, and the transparent layer is a glass layer.

In one embodiment, the first dielectric liquid is an alcohol, the second dielectric liquid is a silicone oil, the transparent electrode layer is implemented by ITO (Indium Tin Oxide), and the enclosing body is implemented by aluminum oxide.

In one embodiment, the first dielectric liquid is an alcohol, the second dielectric liquid is a silicone oil, the transparent electrode layer is implemented by ITO, and the enclosing body is implemented by a plastic material.

In one embodiment, the enclosing body has a reflective layer on an inner surface thereof.

To attain the foregoing objectives, another LED lighting assembly integrated with dielectric liquid lens is proposed, including:

a heat dissipation substrate;

an LED chip, located on the heat dissipation substrate;

a transparent material, covering the heat dissipation substrate and the LED chip, and having a curved surface;

a transparent liquid, located above the transparent material;

a transparent electrode layer, located above the transparent liquid for applying a control voltage to generate a dielectric force;

a first dielectric liquid, located above the transparent electrode layer and having a curved surface, the curved surface having a curvature determined by the dielectric force;

a second dielectric liquid, located above the first dielectric liquid, and having a second dielectric constant smaller than a first dielectric constant of the first dielectric liquid;

a transparent layer, located above the second dielectric liquid; and an enclosing body, having a ring structure combining the heat dissipation substrate, the transparent electrode layer, and the transparent layer to form two enclosed spaces for accommodating the transparent liquid, the first dielectric liquid, and the second dielectric liquid.

In one embodiment, the heat dissipation substrate is an aluminum substrate, the LED chip is a white light LED chip, and the transparent material is a transparent resin.

In one embodiment, the heat dissipation substrate is an aluminum substrate, the LED chip is a non-white light LED chip, and the transparent material is a transparent resin.

In one embodiment, the transparent resin is mixed with a fluorescent powder.

In one embodiment, the transparent liquid is a silicone oil, and the transparent electrode layer is implemented by ITO.

In one embodiment, the transparent liquid is an alcohol, and the transparent electrode layer is implemented by ITO.

In one embodiment, the first dielectric liquid is a silicone oil, the second dielectric liquid is an alcohol, and the transparent layer is a glass layer.

In one embodiment, the enclosing body is implemented by aluminum oxide.

In one embodiment, the enclosing body is implemented by a plastic material.

In one embodiment, the enclosing body has a reflective layer on an inner surface thereof.

To attain the foregoing objectives, another LED lighting assembly integrated with dielectric liquid lens is proposed, including:

a heat dissipation substrate;

an LED chip, located on the heat dissipation substrate;

a first transparent liquid, covering the heat dissipation substrate and the LED chip, and having a curved surface;

a second transparent liquid, located above the first transparent liquid;

a transparent layer, located above the second transparent liquid;

a first dielectric liquid, located above the transparent layer;

a second dielectric liquid, located above the first dielectric liquid and having a curved surface, wherein the first dielectric liquid has a first dielectric constant larger than a second dielectric constant of the second dielectric liquid;

a transparent electrode layer, located above the second dielectric liquid for applying a control voltage to generate a dielectric force to determine a curvature of the second dielectric liquid; and an enclosing body, having a ring structure combining the heat dissipation substrate, the transparent electrode layer, and the transparent layer to form two enclosed spaces for accommodating the first transparent liquid, the second transparent liquid, the first dielectric liquid, and the second dielectric liquid.

In one embodiment, the heat dissipation substrate is an aluminum substrate, the LED chip is a white light LED chip, the first transparent liquid is a silicone oil, and the second transparent liquid is an alcohol.

In one embodiment, the heat dissipation substrate is an aluminum substrate, the LED chip is a non-white light LED chip, the first transparent liquid is a silicone oil, and the second transparent liquid is an alcohol.

In one embodiment, the transparent layer is a glass layer, the first dielectric liquid is an alcohol, the second dielectric liquid is a silicone oil, and the transparent electrode layer is implemented by ITO.

In one embodiment, the enclosing body is implemented by aluminum oxide, and has a reflective layer on an inner surface thereof.

In one embodiment, the enclosing body is implemented by a plastic material, and has a reflective layer on an inner surface thereof.

To attain the foregoing objectives, still another LED lighting assembly integrated with dielectric liquid lens is proposed, including:

a heat dissipation substrate;

an LED chip, located on the heat dissipation substrate;

a first transparent liquid, covering the heat dissipation substrate and the LED chip, and having a curved surface;

a second transparent liquid, located above the first transparent liquid;

a transparent electrode layer, located above the second transparent liquid for applying a control voltage to generate a dielectric force;

a first dielectric liquid, located above the transparent electrode layer and having a curved surface;

a second dielectric liquid, located above the first dielectric liquid and having a second dielectric constant larger than a first dielectric constant of the first dielectric liquid;

a transparent layer, located above the second dielectric liquid; and an enclosing body, having a ring structure combining the heat dissipation substrate, the transparent electrode layer, and the transparent layer to form two enclosed spaces for accommodating the first transparent liquid, the second transparent liquid, the first dielectric liquid, and the second dielectric liquid.

In one embodiment, the heat dissipation substrate is an aluminum substrate, the LED chip is a white light LED chip, the first transparent liquid is a silicone oil, and the second transparent liquid is an alcohol.

In one embodiment, the heat dissipation substrate is an aluminum substrate, the LED chip is a non-white light LED chip, the first transparent liquid is a silicone oil, and the second transparent liquid is an alcohol.

In one embodiment, the transparent electrode layer is implemented by ITO, the first dielectric liquid is a silicone oil, the second dielectric liquid is an alcohol, and the transparent layer is a glass layer.

In one embodiment, the enclosing body is implemented by aluminum oxide and has a reflective layer on an inner surface thereof.

In one embodiment, the enclosing body is implemented by a plastic material and has a reflective layer on an inner surface thereof.

To make it easier for our examiner to understand the objective of the invention, its structure, innovative features, and performance, we use preferred embodiments together with the accompanying drawings for the detailed description of the invention.

BRIEF DESCRIPTION OF THE DRAWINGS

FIG. 1b illustrates an outline of the LED lighting assembly integrated with dielectric liquid lens of FIG. 1a.

DETAILED DESCRIPTION OF THE PREFERRED EMBODIMENTS

The present invention will be described in more detail hereinafter with reference to the accompanying drawings that show the preferred embodiment of the invention.

Figure 1A:
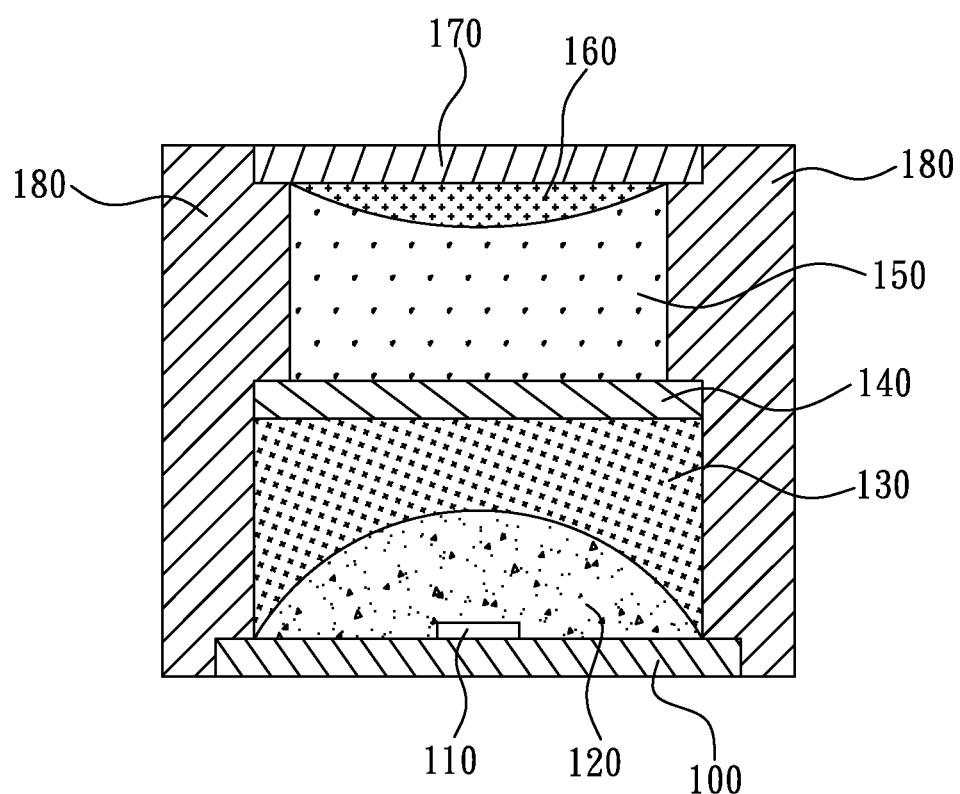
FIG. 1a illustrates an LED lighting assembly integrated with dielectric liquid lens according to a preferred embodiment of the present invention.

Please refer to FIG. 1a, which illustrates an LED lighting assembly integrated with dielectric liquid lens according to a preferred embodiment of the present invention. As illustrated in FIG. 1a, the LED lighting assembly integrated with dielectric liquid lens has a heat dissipation substrate 100, an LED chip 110, a transparent material 120, a transparent liquid 130, a transparent layer 140, a first dielectric liquid 150, a second dielectric liquid 160, a transparent electrode layer 170, and an enclosing body 180.

The heat dissipation substrate 100 is preferably an aluminum substrate capable of dissipating a heat generated by the LED chip 110.

The LED chip 110, located on the heat dissipation substrate 100, can be a white light LED chip or a non-white light LED chip.

The transparent material 120, which can be a transparent resin, covers the heat dissipation substrate 100 and the LED chip 110, and has a curved surface. When the LED chip 110 is a non-white light LED chip, the transparent resin can be mixed with a fluorescent powder of a complement color of the color of the non-white light. For example, when the LED chip 110 is a blue light LED chip, a yellow fluorescent powder can be used to have the blue color mixed with a yellow color to generate a white light.

The transparent liquid 130, which is located above the transparent material 120, can be a silicone oil or an alcohol to assist in dissipating heat.

The transparent layer 140, which is located above the transparent liquid 130, can be a glass layer for blocking a heat generated by the LED chip 110 from entering the first dielectric liquid 150.

The first dielectric liquid 150, located above the transparent layer 140, can be an alcohol; the second dielectric liquid 160, which can be a silicone oil, is located above the first dielectric liquid 150 and has a curved surface. The first dielectric liquid 150 and second dielectric liquid 160 form a liquid lens, with the first dielectric liquid 150 having a first density and a first dielectric constant, the second dielectric liquid 160 having a second density and a second dielectric constant, wherein the first density is preferably equal to the second density, and the first dielectric constant is larger than the second dielectric constant.

Figure 5:
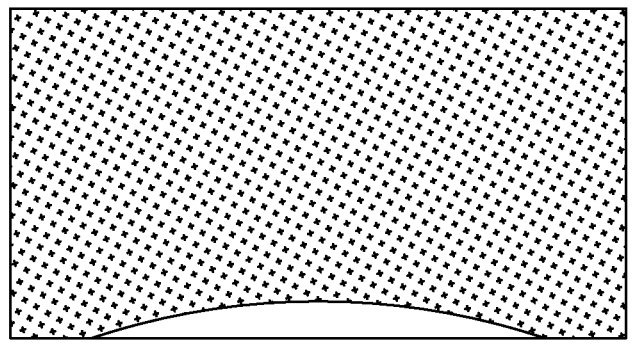
FIG. 5 illustrates different curved surfaces of a second dielectric liquid of FIG. 1a generated in response to different voltages.
Figure 5:
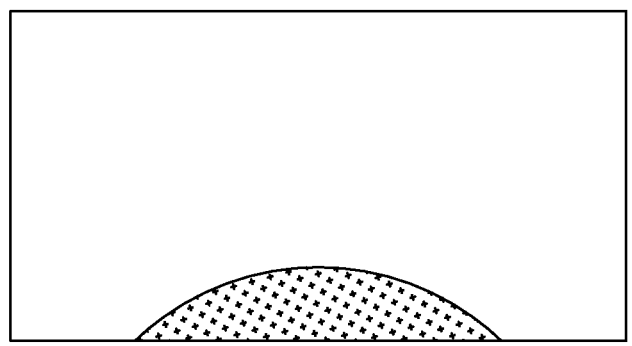
Figure 5:
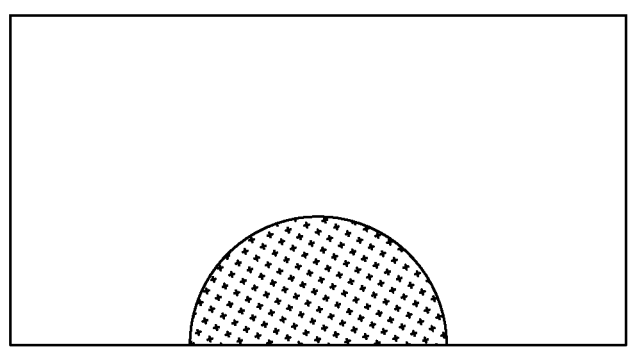

The transparent electrode layer 170, which is located above the second dielectric liquid 160, can be implemented by ITO (Indium Tin Oxide) for applying a control voltage to generate a dielectric force. The dielectric force will take effect on the second dielectric liquid 160 to determine a curvature of the liquid lens. Please refer to FIG. 5, which illustrates different curved surfaces of the second dielectric liquid 160 generated in response to different voltages.

The enclosing body 180, which can be implemented by aluminum oxide or a plastic material, has a ring structure combining with the heat dissipation substrate 100, the transparent layer 140, and the transparent electrode layer 170 to form two enclosed spaces for accommodating the transparent liquid 130, the first dielectric liquid 150, and the second dielectric liquid 160. Besides, the enclosing body 180 can have a reflective layer on an inner surface thereof to increase luminous efficiency.

When in operation, suppose the transparent material 120 has a focal length $f_1$, and the second dielectric liquid has a focal length $f_2$, then the liquid lens will have an effective focal length f, and the effective focal length f can be expressed in terms of $f_1$ and $f_2$ as follows:

$1/f=1/f_1+1/f_2-d/(f_1 \times f_2)$, wherein d is a distance between the curved surface of the transparent material 120 and the curved surface of the second dielectric liquid 160.

Figure 1B:
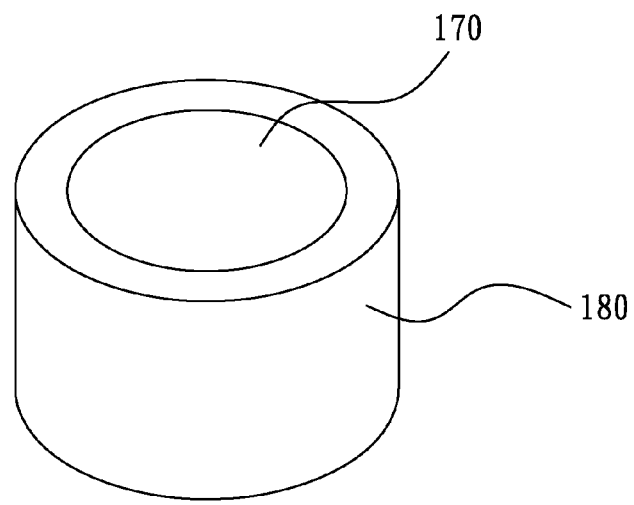

Please refer to FIG. 1b, which illustrates an outline of the LED lighting assembly integrated with dielectric liquid lens of FIG. 1a. Although the outline of the LED lighting assembly shown in FIG. 1b is of a round cylinder shape, it can also be other shapes such as polygonal cylinder.

Figure 2:
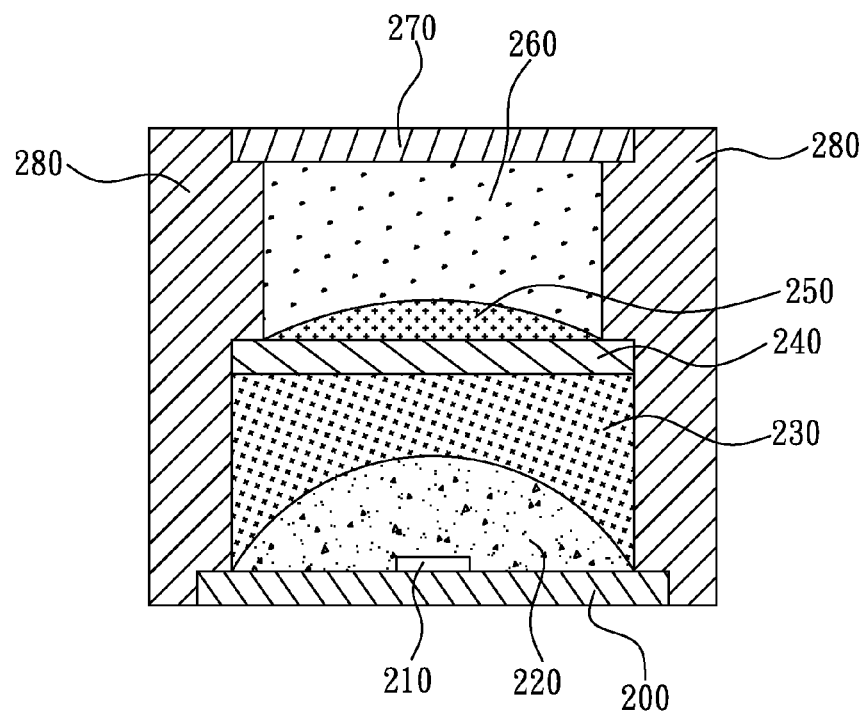
FIG. 2 illustrates an LED lighting assembly integrated with dielectric liquid lens according to another preferred embodiment of the present invention.

Please refer to FIG. 2, which illustrates an LED lighting assembly integrated with dielectric liquid lens according to another preferred embodiment of the present invention. As illustrated in FIG. 2, the LED lighting assembly integrated with dielectric liquid lens has a heat dissipation substrate 200, an LED chip 210, a transparent material 220, a transparent liquid 230, a transparent electrode layer 240, a first dielectric liquid 250, a second dielectric liquid 260, a transparent layer 270, and an enclosing body 280.

The heat dissipation substrate 200 is preferably an aluminum substrate capable of dissipating a heat generated by the LED chip 210.

The LED chip 210, located on the heat dissipation substrate 200, can be a white light LED chip or a non-white light LED chip.

The transparent material 220, which can be a transparent resin, covers the heat dissipation substrate 200 and the LED chip 210, and has a curved surface. When the LED chip 210 is a non-white light LED chip, the transparent resin can be mixed with a fluorescent powder of a complement color of the color of the non-white light. For example, when the LED chip 210 is a blue light LED chip, a yellow fluorescent powder can be used to have the blue color mixed with a yellow color to generate a white light.

The transparent liquid 230, which is located above the transparent material 220, can be a silicone oil or an alcohol to assist in dissipating heat.

The transparent electrode layer 240, located above the transparent liquid 230, can be implemented by ITO (Indium Tin Oxide) for applying a control voltage to generate a dielectric force. The dielectric force will take effect on the first dielectric liquid 250 to determine a curvature of the first dielectric liquid 250.

The first dielectric liquid 250, located above the transparent electrode layer 240, can be a silicone oil and has a curved surface; the second dielectric liquid 260, which can be an alcohol, is located above the first dielectric liquid 250. The first dielectric liquid 250 and second dielectric liquid 260 form a liquid lens, with the first dielectric liquid 250 having a first density and a first dielectric constant, the second dielectric liquid 260 having a second density and a second dielectric constant, wherein the first density is preferably equal to the second density, and the first dielectric constant is smaller than the second dielectric constant.

The transparent layer 270, which is located above the second dielectric liquid 260, can be a glass layer. The enclosing body 280, which can be implemented by aluminum oxide or a plastic material, has a ring structure combining with the heat dissipation substrate 200, the transparent electrode layer 240, and the transparent layer 270 to form two enclosed spaces for accommodating the transparent liquid 230, the first dielectric liquid 250, and the second dielectric liquid 260. Besides, the enclosing body 280 can have a reflective layer on an inner surface thereof to increase luminous efficiency.

Figure 3:
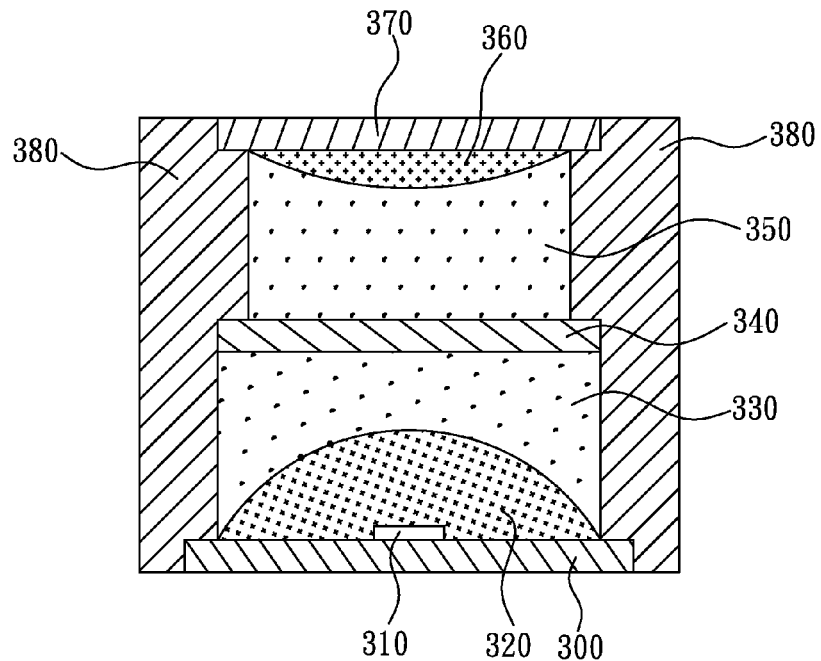
FIG. 3 illustrates an LED lighting assembly integrated with dielectric liquid lens according to another preferred embodiment of the present invention.

Please refer to FIG. 3, which illustrates an LED lighting assembly integrated with dielectric liquid lens according to another preferred embodiment of the present invention. As illustrated in FIG. 3, the LED lighting assembly integrated with dielectric liquid lens has a heat dissipation substrate 300, an LED chip 310, a first transparent liquid 320, a second transparent liquid 330, a transparent layer 340, a first dielectric liquid 350, a second dielectric liquid 360, a transparent electrode layer 370, and an enclosing body 380.

The heat dissipation substrate 300 is preferably an aluminum substrate capable of dissipating a heat generated by the LED chip 310.

The LED chip 310, located on the heat dissipation substrate 300, can be a white light LED chip or a non-white light LED chip.

The first transparent liquid 320, which can be a silicone oil, covers the heat dissipation substrate 300 and the LED chip 310, and has a curved surface; the second transparent liquid 330, located above the first transparent liquid 320, can be an alcohol. The first transparent liquid 320 and the second transparent liquid 330 form a first liquid lens. The silicone oil can assist in dissipating heat. Besides, electrodes can be formed on the heat dissipation substrate 300 for applying a voltage to determine a curvature of the first liquid lens.

The transparent layer 340, which is located above the second transparent liquid 330, can be a glass layer for blocking a heat generated by the LED chip 310 from entering the first dielectric liquid 350.

The first dielectric liquid 350, located above the transparent layer 340, can be an alcohol; the second dielectric liquid 360, which can be a silicone oil, is located above the first dielectric liquid 350 and has a curved surface. The first dielectric liquid 350 and second dielectric liquid 360 form a second liquid lens, with the first dielectric liquid 350 having a first density and a first dielectric constant, the second dielectric liquid 360 having a second density and a second dielectric constant, wherein the first density is preferably equal to the second density, and the first dielectric constant is larger than the second dielectric constant.

The transparent electrode layer 370, located above the second dielectric liquid 360, can be implemented by ITO for applying a control voltage to generate a dielectric force. The dielectric force will take effect on the second dielectric liquid 360 to determine a curvature of the second liquid lens.

The enclosing body 380, which can be implemented by aluminum oxide or a plastic material, has a ring structure combining with the heat dissipation substrate 300, the transparent layer 340, and the transparent electrode layer 370 to form two enclosed spaces for accommodating the first transparent liquid 320, the second transparent liquid 330, the first dielectric liquid 350, and the second dielectric liquid 360. Besides, the enclosing body 380 can have a reflective layer on an inner surface thereof to increase luminous efficiency.

Figure 4:
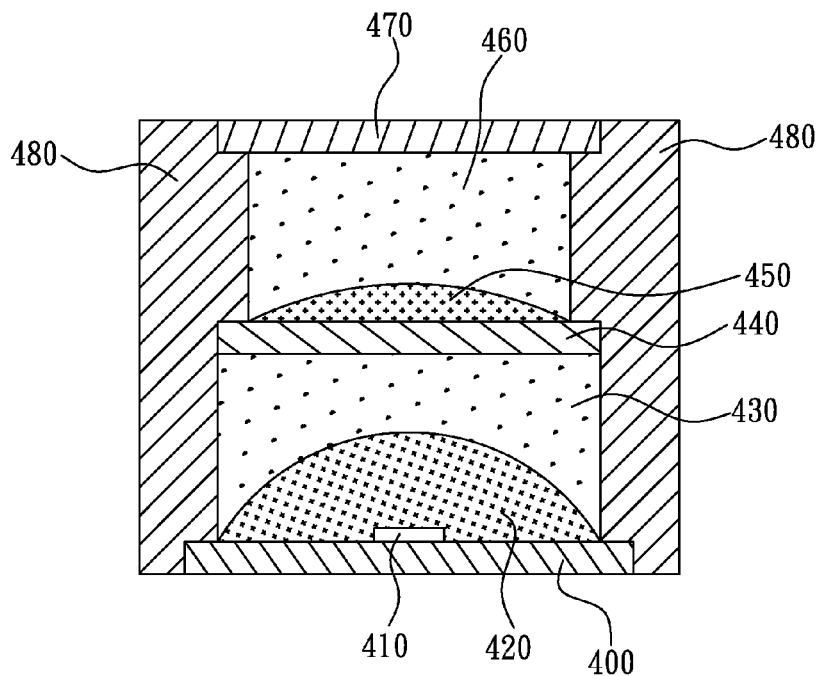
FIG. 4 illustrates an LED lighting assembly integrated with dielectric liquid lens according to still another preferred embodiment of the present invention.

Please refer to FIG. 4, which illustrates an LED lighting assembly integrated with dielectric liquid lens according to still another preferred embodiment of the present invention. As illustrated in FIG. 4, the LED lighting assembly integrated with dielectric liquid lens has a heat dissipation substrate 400, an LED chip 410, a first transparent liquid 420, a second transparent liquid 430, a transparent electrode layer 440, a first dielectric liquid 450, a second dielectric liquid 460, a transparent layer 470, and an enclosing body 480.

The heat dissipation substrate 400 is preferably an aluminum substrate capable of dissipating a heat generated by the LED chip 410.

The LED chip 410, located on the heat dissipation substrate 400, can be a white light LED chip or a non-white light LED chip.

The first transparent liquid 420, which can be a silicone oil, covers the heat dissipation substrate 400 and the LED chip 410, and has a curved surface; the second transparent liquid 430, located above the first transparent liquid 420, can be an alcohol. The first transparent liquid 420 and the second transparent liquid 430 form a first liquid lens. The silicone oil can assist in dissipating heat. Besides, electrodes can be formed on the heat dissipation substrate 400 for applying a voltage to determine a curvature of the first liquid lens.

The transparent electrode layer 440, located above the second transparent liquid 430, can be implemented by ITO for applying a control voltage to generate a dielectric force. The dielectric force will take effect on the first dielectric liquid 450 to determine a curvature of the first dielectric liquid 450.

The first dielectric liquid 450, which can be a silicone oil, is located above the transparent electrode layer 440 and has a curved surface; the second dielectric liquid 460, which can be an alcohol, is located above the first dielectric liquid 450. The first dielectric liquid 450 and second dielectric liquid 460 form a second liquid lens, with the first dielectric liquid 450 having a first density and a first dielectric constant, the second dielectric liquid 460 having a second density and a second dielectric constant, wherein the first density is preferably equal to the second density, and the first dielectric constant is smaller than the second dielectric constant.

The transparent layer 470, which is located above the second dielectric liquid 460, can be a glass layer. The enclosing body 480, which can be implemented by aluminum oxide or a plastic material, has a ring structure combining with the heat dissipation substrate 400, the transparent electrode layer 440, and the transparent layer 470 to form two enclosed spaces for accommodating the first transparent liquid 420, the second transparent liquid 430, the first dielectric liquid 450, and the second dielectric liquid 460. Besides, the enclosing body 480 can have a reflective layer on an inner surface thereof to increase luminous efficiency.

Thanks to the designs described above, the present invention possesses the advantages as follows:

1. The LED lighting assembly integrated with dielectric liquid lens of the present invention has a heat dissipation substrate carrying an LED chip and providing a heat dissipation function.

2. The LED lighting assembly integrated with dielectric liquid lens of the present invention is capable of using a liquid to assist in dissipating heat.

3. The LED lighting assembly integrated with dielectric liquid lens of the present invention possesses a robust package convenient for transportation.

4. The LED lighting assembly integrated with dielectric liquid lens of the present invention has a composite focal length formed by two focal lengths to facilitate generating a light pattern of the LED lighting assembly.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:
1. An LED lighting assembly integrated with dielectric liquid lens, comprising:
a heat dissipation substrate;
an LED chip, located on said heat dissipation substrate;

a transparent material, covering said heat dissipation substrate and said LED chip, and having a curved surface;
a transparent liquid, located above said transparent material;
a transparent layer, located above said transparent liquid;
a first dielectric liquid, located above said transparent layer;
a second dielectric liquid, located above said first dielectric liquid and having a curved surface, wherein said second dielectric liquid has a second dielectric constant smaller than a first dielectric constant of said first dielectric liquid;
a transparent electrode layer, located above said second dielectric liquid for applying a control voltage to generate a dielectric force on said second dielectric liquid; and
an enclosing body, having a ring structure combining with said heat dissipation substrate, said transparent layer, and said transparent electrode layer to form two enclosed spaces for accommodating said transparent liquid, said first dielectric liquid, and said second dielectric liquid.

2. The LED lighting assembly integrated with dielectric liquid lens as claim 1, wherein said heat dissipation substrate is an aluminum substrate, and said transparent material is a transparent resin.

3. The LED lighting assembly integrated with dielectric liquid lens as claim 2, wherein said transparent resin is mixed with a fluorescent powder.

4. The LED lighting assembly integrated with dielectric liquid lens as claim 1, wherein said LED chip is a white light LED chip or a non-white light LED chip.

5. The LED lighting assembly integrated with dielectric liquid lens as claim 1, wherein said transparent liquid is a silicone oil or an alcohol, and said transparent layer is a glass layer.

6. The LED lighting assembly integrated with dielectric liquid lens as claim 1, wherein said first dielectric liquid is an alcohol, said second dielectric liquid is a silicone oil, said transparent electrode layer is implemented by ITO, and said enclosing body is implemented by aluminum oxide or a plastic material.

7. The LED lighting assembly integrated with dielectric liquid lens as claim 1, wherein said enclosing body has a reflective layer on an inner surface thereof.

8. An LED lighting assembly integrated with dielectric liquid lens, comprising:
a heat dissipation substrate;
an LED chip, located on said heat dissipation substrate;
a transparent material, covering said heat dissipation substrate and said LED chip, and having a curved surface;
a transparent liquid, located above said transparent material;
a transparent electrode layer, located above said transparent liquid for applying a control voltage to generate a dielectric force;
a first dielectric liquid, located above said transparent electrode layer and having a curved surface, said curved surface having a curvature determined by said dielectric force;
a second dielectric liquid, located above said first dielectric liquid, and having a second dielectric constant smaller than a first dielectric constant of said first dielectric liquid;
a transparent layer, located above said second dielectric liquid; and
an enclosing body, having a ring structure combining said heat dissipation substrate, said transparent electrode layer, and said transparent layer to form two enclosed spaces for accommodating said transparent liquid, said first dielectric liquid, and said second dielectric liquid.

9. The LED lighting assembly integrated with dielectric liquid lens as claim 8, wherein said heat dissipation substrate is an aluminum substrate, said LED chip is a white light LED chip or a non-white light LED chip, and said transparent material is a transparent resin.

10. The LED lighting assembly integrated with dielectric liquid lens as claim 9, wherein said transparent resin is mixed with a fluorescent powder.

11. The LED lighting assembly integrated with dielectric liquid lens as claim 8, wherein said transparent liquid is a silicone oil or an alcohol, and said transparent electrode layer is implemented by ITO.

12. The LED lighting assembly integrated with dielectric liquid lens as claim 8, wherein said first dielectric liquid is a silicone oil, said second dielectric liquid is an alcohol, and said transparent layer is a glass layer.

13. The LED lighting assembly integrated with dielectric liquid lens as claim 8, wherein said enclosing body is implemented by aluminum oxide or a plastic material.

14. The LED lighting assembly integrated with dielectric liquid lens as claim 8, wherein said enclosing body has a reflective layer on an inner surface thereof.

15. An LED lighting assembly integrated with dielectric liquid lens, comprising:
a heat dissipation substrate;
an LED chip, located on said heat dissipation substrate;
a first transparent liquid, covering said heat dissipation substrate and said LED chip, and having a curved surface;
a second transparent liquid, located above said first transparent liquid;
a transparent layer, located above said second transparent liquid;
a first dielectric liquid, located above said transparent layer;
a second dielectric liquid, located above said first dielectric liquid and having a curved surface, wherein said first dielectric liquid has a first dielectric constant larger than a second dielectric constant of said second dielectric liquid;
a transparent electrode layer, located above said second dielectric liquid for applying a control voltage to generate a dielectric force to determine a curvature of said second dielectric liquid; and
an enclosing body, having a ring structure combining said heat dissipation substrate, said transparent layer, and said transparent electrode layer to form two enclosed spaces for accommodating said first transparent liquid, said second transparent liquid, said first dielectric liquid, and said second dielectric liquid.

16. The LED lighting assembly integrated with dielectric liquid lens as claim 15, wherein said heat dissipation substrate is an aluminum substrate, said LED chip is a white light LED chip or a non-white light LED chip, said first transparent liquid is a silicone oil, and said second transparent liquid is an alcohol.

17. The LED lighting assembly integrated with dielectric liquid lens as claim 15, wherein said transparent layer is a glass layer, said first dielectric liquid is an alcohol, said second dielectric liquid is a silicone oil, and said transparent electrode layer is implemented by ITO.

18. The LED lighting assembly integrated with dielectric liquid lens as claim 15, wherein said enclosing body is implemented by aluminum oxide or a plastic material, and has a reflective layer on an inner surface thereof.

19. An LED lighting assembly integrated with dielectric liquid lens, comprising:
   a heat dissipation substrate;
   an LED chip, located on said heat dissipation substrate;
   a first transparent liquid, covering said heat dissipation substrate and said LED chip, and having a curved surface;
   a second transparent liquid, located above said first transparent liquid;
   a transparent electrode layer, located above said second transparent liquid for applying a control voltage to generate a dielectric force;
   a first dielectric liquid, located above said transparent electrode layer and having a curved surface;
   a second dielectric liquid, located above said first dielectric liquid and having a second dielectric constant larger than a first dielectric constant of said first dielectric liquid;
   a transparent layer, located above said second dielectric liquid; and
   an enclosing body, having a ring structure combining said heat dissipation substrate, said transparent electrode layer, and said transparent layer to form two enclosed spaces for accommodating said first transparent liquid, said second transparent liquid, said first dielectric liquid, and said second dielectric liquid.

20. The LED lighting assembly integrated with dielectric liquid lens as claim 19, wherein said heat dissipation substrate is an aluminum substrate, said LED chip is a white light LED chip or a non-white light LED chip, said first transparent liquid is a silicone oil, and said second transparent liquid is an alcohol.

21. The LED lighting assembly integrated with dielectric liquid lens as claim 19, wherein said transparent electrode layer is implemented by ITO, said first dielectric liquid is a silicone oil, said second dielectric liquid is an alcohol, and said transparent layer is a glass layer.

22. The LED lighting assembly integrated with dielectric liquid lens as claim 19, wherein said enclosing body is implemented by aluminum oxide or a plastic material, and has a reflective layer on an inner surface thereof.

\* \* \* \* \*